United States Patent [19]

Eichelberger et al.

[11] 4,362,903

[45] Dec. 7, 1982

[54] ELECTRICAL CONDUCTOR INTERCONNECT PROVIDING SOLDERABLE CONNECTIONS TO HARD-TO-CONTACT SUBSTRATES, SUCH AS LIQUID CRYSTAL CELLS

[75] Inventors: Charles W. Eichelberger, Schenectady; Wesley K. Waldron, Scotia; Robert J. Wojnarowski, Clifton Park, all of N.Y.

[73] Assignee: General Electric Company, Schenectady, N.Y.

[21] Appl. No.: 220,331

[22] Filed: Dec. 29, 1980

[51] Int. Cl.³ ............................ B23K 1/20; G02F 1/13
[52] U.S. Cl. .................................. 174/94 R; 228/209; 350/334
[58] Field of Search ............ 174/94 R; 350/334, 336; 228/208, 209; 403/270, 271, 272; 339/275 C; 427/103, 118

[56] References Cited

U.S. PATENT DOCUMENTS

| | | |
|---|---|---|
| 3,332,860 | 7/1967 | Diebold et al. |
| 3,947,090 | 3/1976 | Yaguchi et al. ..................... 350/336 |
| 3,947,375 | 3/1976 | Gray et al. ......................... 350/336 |
| 4,284,665 | 8/1981 | Heimala et al. |

*Primary Examiner*—A. T. Grimley
*Assistant Examiner*—D. A. Tone
*Attorney, Agent, or Firm*—Geoffrey H. Krauss; James C. Davis, Jr.; Marvin Snyder

[57] ABSTRACT

An electrical conductor interconnect is disclosed which permits hard-to-contact substrates, such as the glass substrate in liquid crystal display cells, to be connected to electrical apparatus by conventional soldering techniques. The interconnect conductor involves the use of a polymer loaded with both a conducting powder and a non-noble metal powder whose top surface is coated with a contiguous layer of an adherent solderable metal by an augmentation replacement reaction.

35 Claims, 1 Drawing Figure

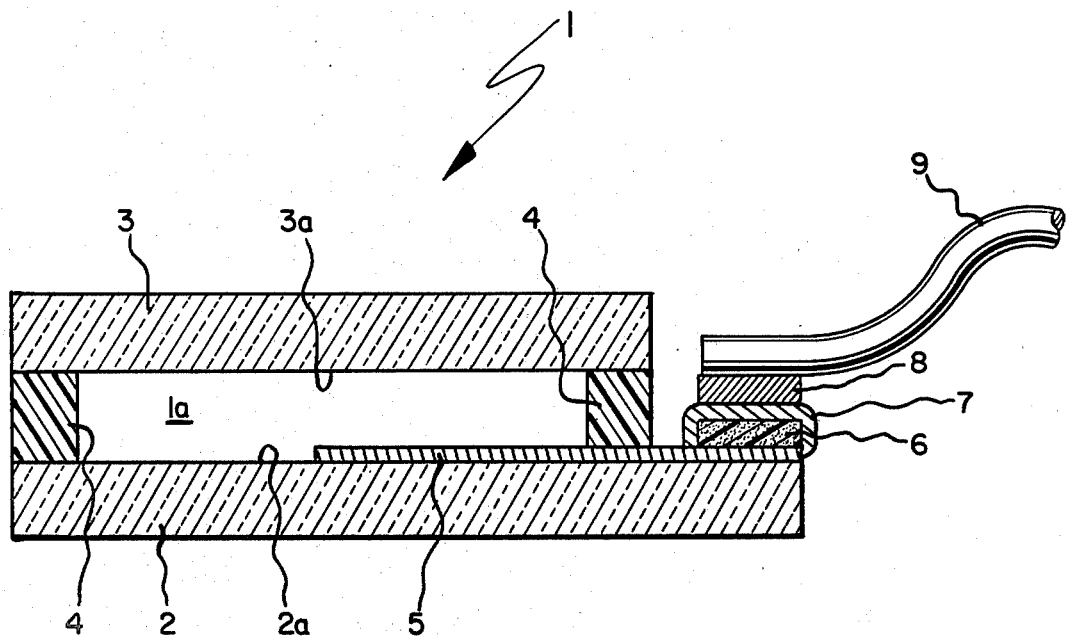

ELECTRICAL CONDUCTOR INTERCONNECT PROVIDING SOLDERABLE CONNECTIONS TO HARD-TO-CONTACT SUBSTRATES, SUCH AS LIQUID CRYSTAL CELLS

RELATED APPLICATIONS

Include Ser. Nos. 220,341; 220,342; 220,343; 220,344 and 220,937, all filed Dec. 29, 1980; and 220,332 having a filing date of Mar. 11, 1981.

BACKGROUND OF THE INVENTION

Many types of electronic apparatus are known in which the various electrical components are interconnected by conductors. The interconnecting conductors are fabricated in a wide variety of processes such as, for example, thick film fired conductor systems, polymer conductors and printed circuit boards.

In thick film fired conductors, a mixture of a conducting metal powder, a ceramic or glass binder and an appropriate vehicle is screen printed on a substrate. The conductor pattern on the substrate is then fired at a relatively high temperature, typically between 650° and 900° C. As the temperature rises to the firing temperature, the vehicle is volatilized leaving the metal and binder behind. At the firing temperature, sintering of the metal takes place to a greater or lesser extent with the binder providing adhesion between the metal film formed and the substrate.

Thick film fired conductors have classically employed precious metals such as gold, silver, platinum and palladium. Recently these noble metals have soared in cost, and new conductor systems using copper, nickel and aluminum are being made commercially available. The cost of the precious metal systems is prohibitive where a low cost conductor system is desired. The newer metal systems are not significantly cheaper because of the special chemistry which is required to prevent oxidation of the metal during the firing process. Moreover, these systems are very difficult to solder using the conventional tin/lead solder and the high firing temperatures required during fabrication preclude the use of low cost substrate materials. Some of the nickel systems can be fired on soda-lime glass at temperatures just below the melting point of the glass but the resulting conductivity of the conductor is relatively low.

The term "polymer conductor" is actually a misnomer since the polymer is not actually a conductor. Instead, the polymer is heavily loaded with a conducting metal and screened on to a substrate. The advantage of this system is that the polymer can be cured either catalytically or thermally at temperatures which range from room temperature to about 125° C. As a result of this so-called "cold processing", it is possible to use very inexpensive substrates such as films of Mylar (polyethylene terephthalate). The mechanism by which conductivity is achieved is supplied entirely by contact between individual metallic particles. It has been found that the only metals which can be loaded into the polymer and give acceptable conductivity are the precious metals such as gold and silver. All of the other standard conducting metals oxidize over a period of time reducing the conductivity between the particles. Silver has been the predominant choice in polymer conductor systems but the silver systems are generally not solderable because the silver is leached by the lead-tin solder. When the price of silver is about $10–11 per ounce, these conductor systems are competitive with other systems if used on very low cost substrates such as thin mylar films. However, when the price of silver is higher, the systems are not competitive with printed circuit boards.

The techniques used to prepare printed circuit boards can be divided into additive and subtractive technologies. In both, the starting point is a substrate, which can vary widely from phenolics to glass filled epoxies, on which a copper foil is bonded. In the additive preparatory system, the copper foil is very thin, usually on the order of about 200 microinches. A resist is patterned such that the copper is exposed only where the conductors are desired and the board is then electroplated to form copper conductors of about 1 mil in thickness. The plating resist is stripped and the copper is etched. In areas where the conductor is not desired, the copper is only about 200 microinches thick so that etching quickly removes this copper while leaving a 1 mil thick conductor. In the subtractive process, the starting thickness of the copper foil is usually between 1 and 2 mils. An etch resist is deposited wherever the conductors are desired, the board is etched and the resist is then removed. The resist prevents etching where the conductors are desired leaving conductor runs.

Both the additive and subtractive printed circuit board procedures require the application of a copper foil over the entire substrate, deposition and removal of a resist, etching of the printed circuit board, drilling holes for component insertion, and in one case, the additional step of electroplating. An advantage of this technology is, however, that the resulting circuit boards can be relatively easily soldered.

The most significant drawbacks of the printed circuit board technology is that a substantial number of processing steps are necessary and this requires a large amount of associated equipment. In addition, the choice of substrate materials is limited to one of those available for circuit board materials. The number of process steps and equipment results in relatively high processing costs and the limitation of the substrate materials eliminates the opportunity to use a decorative or structural member which may be required in the apparatus as the substrate. Typical total costs for processed printed circuit boards range from $0.03 to $1.00 per square inch depending on the quality of the board, whether single sided or double sided and whether plated through holes are used.

Providing reliable electrical connections to some substrates have posed particular difficulties. One system which has posed a continual problem is liquid crystal cells where the connection must be made to a multiplicity of tin oxide conductor patterns which are formed on a glass surface. This connection has usually been made by mechanical means, such as by pressure contacts, but such pressure contacts to tin oxide patterns on glass are fraught with problems. The contact must be extremely compliant because the glass is essentially non-compliant and this becomes a greater factor as the number of connections required increases. The problem is complicated by the fact that most materials do not form good ohmic contact with tin oxide patterns on glass and, additionally, there is no way to index the contact because there is effectively no height associated with the tin oxide pattern rising above the glass surface. Still further, if the glass is scratched, the tin oxide conductor is also scratched and an open circuit results. Finally, it is desirable in many installations to mount the liquid crystal cell flush with the surface and in such installations, there is no room for a complex connector.

The prior art techniques are not particularly adapted to forming electrical conductor interconnects with such hard to connect substrates. For example, the conventional thick film techniques generate several additional problems because the firing step required raises the temperature to close to the melting point of the glass and, therefore, tends to warp the glass which is extremely undesirable in liquid crystal technology. The firing also tends to form an oxide film on the tin oxide resulting in a rainbow effect which is also undesirable in a display cell.

BRIEF SUMMARY OF THE INVENTION

In accordance with the invention, an electrical conductor interconnect is fabricated with a first electrical conductor, upon a portion of which is fabricated an interconnect formation. The formation comprises a cured polymer containing a finely divided first metallic composition and a second metal and a conductive powder therein, and a contiguous layer of second metal thereon, wherein the second metal is below the first metal in the activity series, and both said cured polymer and contiguous layer are electrically conductive and in electrical contact. The contiguous conductor layer is prepared by first establishing the cured polymer containing the finely divided metal and the conductive power on a desired substrate and thereafter conducting that polymer with a salt of the second metal. A second conductor is attached to the contiguous layer, as by soldering and the like operations.

It is an object of this invention to provide a new electrical conductor interconnect which is particularly useful in conjunction with hard-to-connect substrates, such as liquid crystal cells, to provide a solderable connection without requiring high temperature processing, at low cost, and which is amenable to batch fabrication and/or automated assembly techniques. This and other objects of the invention will become apparent to those of ordinary skill in this art from the following detailed description, where considered with the sole drawing.

DESCRIPTION OF THE DRAWING

The sole FIGURE is a cross-section of a liquid crystal display cell interconnected to a flexible electrical cable in accordance with the present invention.

DESCRIPTION OF THE INVENTION

The process of the present invention, in its broadest form, involves the establishment of a desired conductive formation on a substrate in such manner as to facilitate a solderable connection thereto with a wire external to the substrate. The conductive formation is established by means of a conductive-powder containing cured polymer which is subjected to an augmentation replacement reaction. The process is particularly adapted for use of screen printing techniques to establish the conductor formations on the substrates, although the invention is not so limited. Other types of printing and application techniques can be used including, without limitation, pad flexographic printing, stencil, rotogravure and offset printing.

The substrate on which the conductive formations are formed is not restricted and any insulator to which the metal ink can be adhered is employable. Thus, the usual printed circuit substrates can be used, as well as glass filled polyesters, phenolic boards, polystyrene and the like. Of particular interest as substrates for use in the present invention is glass and steel which is covered with an insulator such as porcelain or epoxy. The latter materials are often used as structural or decorative elements in many constructions and applying electronic elements directly to them provides advantages with respect to ease of fabrication, essential structural members and cost. Where the substrate is a liquid crystal display cell, the substrate will be glass on which a multiplicity of tin oxide conductor patterns will have been formed by conventional liquid crystal cell fabrication techniques.

The metal inks used in the present invention are a combination of a finely-divided metallic powder composition with a polymer whose viscosity and flow characteristics are controlled by the incorporation of a solvent therein. The metal can be any metal which: is stable in the ink and cured polymer; can be obtained in finely divided form; and is placed above the metal used in the augmentation replacement reaction in the activity series of the metals. Because of its availability and low cost, the preferred metal is iron. The metal powder generally has a particle size of less than about 50 microns, preferably 3 to about 25 microns and most preferably less than 10 microns. When the ink is deposited by screen printing, the metal particles must be of a size to pass through the screen.

The conductive powder is any powdered material which can be incorporated into the polymer without adversely affecting the metal ink. The metal ink will usually cover most, if not all, of the tin oxide on at least a portion of the surface of the glass in liquid crystal display cells and there must, therefore, be some conduction between the underlying tin oxide and the conductive contiguous layer to be formed on the metal ink. In some cases and under some conditions, the finely divided metal can provide the desired conductivity but in order to achieve a universal interconnect and improve reliability, the conductive powder should be employed. The conductive powder can be a conductive metal which does or does not take part in the augmentation replacement reaction described below. For example, silver powder can be used, but this increases the cost of the interconnect metal ink. The preferred conductive powder is brown tungsten oxide. Materials such as carbon can also be used but may result in a higher resistivity. It should be appreciated, however, that even materials with high resistivity per square can be used with advantage in the present invention because of the physical dimensions involved, that is, as a result of geometric considerations. For example, the interconnect to liquid crystal display cells is about 1 mil. thick and is typically 50 mils by 100 mils in cross-sectional area. The resistivity can be calculated by the equation $$R = \rho(l/A) \tag{1}$$

where $\rho$ is the resistivity in ohm-inch, l is the path length in inches and A is the area in square inches. Thus, in a typical liquid crystal display interconnect, $$R = \rho(0.001/0.1 \times 0.05) = \rho(0.2) \tag{2}$$

whereas in calculating ohms per square for a typical thick-film conductor 1 mil thick the resistance per square would be $$R = \rho(1 \text{ inch}/0.001 \text{ inch})(1 \text{ inch})) = 1000\rho \qquad (3)$$

Note that, for a given resistivity $\rho$, the foregoing geometric example yields a 1000/0.2 or 5000/1 reduction in resistance.

The particle size of the conductive powder is governed by the same considerations described above with respect to the finely divided metal powder.

The polymers employed in the ink are any curable material or mixture thereof which exhibits a degree of adhesion to the substrate being employed and to the finely divided metal powder which is dispersed therein. Typical polymers which can be employed include the homopolymers and copolymers of ethylenically unsaturated aliphatic, alicyclic and aromatic hydrocarbons such as polyethylene, polypropylene, polybutene, ethylene propylene copolymers, copolymers of ethylene or propylene with other olefins, polybutadiene, polyisoprene, polystyrene and polymers of pentene, hexene, heptene, bicyclo(2,2,1)2-heptane, methyl styrene and the like. Other polymers which can be used include polyindene, polymers of acrylate esters and polymers of methacrylate esters, acrylate and methacrylate resins such as ethyl acrylate, n-butyl methacrylate, isobutyl methacrylate, ethyl methacrylate and methyl methacrylate; alkyd resins; cellulose derivatives such as cellulose acetate, cellulose acetate butyrate, cellulose nitrate, ethyl cellulose, hydroxyethyl cellulose, methyl cellulose, and sodium carboxymethyl cellulose; epoxy resins; hydrocarbon resins from petroleum; isobutylene resins; isocyanate resins (polyurethanes); melamine resins such as melamine-formaldehyde and melamine-urea-formaldehyde; oleo-resins; polyamide polymers such as polyamides and polyamide-epoxy polyesters; polyester resins such as the unsaturated polyesters of dibasic acids and dihydroxy compounds; polyester elastomer and resorcinol resins such as resorcinol-formaldehyde; resorcinol-furfural, resorcinol-phenol-formaldehyde and resorcinol-urea; rubbers such as natural rubber, reclaimed rubber, chlorinated rubber, butadiene styrene rubber, and butyl rubber, neoprene rubber, polysulfide, vinyl acetate and vinyl alcohol-acetate copolymers, polyvinyl alcohol, polyvinyl chloride, polyvinyl pyrollidone and polyvinylidene chloride, polycarbonates, graft copolymers of polymers of unsaturated hydrocarbons and of unsaturated monomers such as graft copolymers of polybutadiene, styrene and acrylonitrile, commonly called ABS resins, polyamides and the like, including other examples listed in copending application Ser. No. 220,342, incorporated herein in its entirety by reference.

The polymers and inks of the present invention can contain various other materials such as fillers, e.g., glass fiber, glass powder, glass beads, asbestos, mineral fillers, wood flower and other vegetable fillers, dyes, pigments, waxes, stabilizers, lubricants, curing catalysts such as peroxides, photosensitizers and amines, polymerization inhibitors and the like. It is preferred, but not essential, to employ a polymer which exhibits a substantial degree of volumetric shrinkage upon curing.

The amounts of the finely divided metal and polymer are adjusted such that the metal powder and conductive powder constitute about 60–80% by volume of the mixture after curing. Preferably, the powder component is about 70% by volume. It is desired to have a significant amount of the metal particles forming part of the surface of the cured ink to facilitate the subsequent augmentation replacement reaction. The amount of the conductive powder is that sufficient to render the polymer layer conductive after curing and is usually about 40–60 weight percent, and most preferably about 45–55 weight percent, based on the combined weight of the finely divided metal and conductive powder.

A solvent is used in the ink formulation in order to adjust the viscosity and flow characteristics for the type of printing desired. In general, the solvent should be employed in an amount sufficient that the ink has a viscosity of 15,000–200,000 cps at room temperature and preferably about 50,000–150,000 cps. Suitable solvents or diluents can be aliphatic or aromatic and usually contain up to about 30 carbon atoms. They include the hydrocarbons, ethers and thioethers, carbonyl compounds such as esters and ketones, nitrogen containing compounds such as amides, amines, nitriles and nitro compounds, alcohols, phenols, mercaptans and halogen containing compounds. Examples include alcohols such as methanol, ethanol, propanol, benzyl alcohol, cyclohexanol, ethylene glycol, glycerol and the like, aromatic materials such as benzene, toluene, xylene, ethyl benzene, naphthalene, tetralin and the like ethers such as methyl ether, ethyl ether, propyl ether, methyl t-butyl ether, and the like, alkanes such as methane, ethane, propane and the like, dimethyl sulfoxide, butyl formate, methyl acetate, ethyl acetate, formamide, dimethyl formamide, acetamide, acetone, nitrobenzene, monochlorobenzene, acetophenone, tetrahydrofuran, chloroform, carbon tetrachloride, trichloroethylene, ethylbromide, phenol, mercaptophenol, and the like. Additionally, reactive solvents or diluents such as triallyl isocyanurate can be used if desired. It is preferred to employ a solvent which is relatively non-volatile at room temperature so that the viscosity and flow of the ink is appropriate during application to the substrate and highly volatile at the curing temperature of the polymer or at other temperatures above the application temperature. The carbitol series of solvents and particularly butyl carbitol (diethylene glycol monobutyl ether) has been found to be particularly appropriate.

The ink is applied to the substrate to achieve the desired conductor patterns thereon. For example, standard printed circuit application technology can be employed. Any temperature which will not cause premature curing of the ink and at which the viscosity and flow characteristics of the ink are appropriate to the application technique used can be employed. It is preferred, but not necessary, to permit at least a portion of the solvent to evaporate after application of the ink to the substrate and before curing. The act of evaporation exposes additional metal powder and increases the ratio of powders to polymer so as to achieve a balance between sufficient metal to provide a base for the conductive film to be formed thereon and too little polymer to act as a binder to hold the metal particles. Preferably, the drying is effected for 0.1–1 hour, more preferably about 0.25–0.5 hour, at a temperature of about 70°–150° C., most preferably about 110°–130° C.

In the next step in the instant process, the ink polymer is cured or polymerized by the most convenient method. If an autocatalyst has been added, the polymer will cure by itself with no additional initiation. In the case of ultraviolet light initiators, the substrates carrying the conductor patterns can be passed under a high intensity ultraviolet source which causes the initiators to begin the curing reaction. It is presently preferred to employ a thermal curing system which is activated by exposure to temperatures of about 140°–200° C., preferably about 150°–180° C., for a time of 0.1–1 hour, preferably 0.15–0.5 hour. As a result of this step, a closely compacted metal powder and conductive powder bound to the substrate by the cured polymer is achieved. Because of the high percentage of metal and conductive powder, and shrinkage of the polymer chosen, the pattern thus obtained will have conductivity due to the physical contact between the conductive powder particles. In liquid crystal applications, a series resistance of 200 ohm is acceptable. This translates (by the use of Equations 1, 2 and 3) into 1,000,000 ohms/square, if the above-described typical dimensions and thicknesses are assumed.

The ink designed substrate is subjected to an augmentation replacement reaction in which some of the metal of the powder is replaced by a metal further down in the activity series, i.e., which is more noble. This step takes advantage of the known chemical behavior of metals that any metal will displace any succeeding, less active, metal from a water solution of one of its salts. However, in this invention, it has been found that while the powder metal enters into solution, an amount of more noble metal is deposited at the surface beyond that which would form a one to one exchange with the powder metal. The additional metal from the solution plates to the original and replacement metal particles which are adhered to the substrate by the polymer to interconnect all metal particles at the surface and thus form a contiguous film of conductive metal over the printed conductor pattern. It has been found that several hundred microinches of conductor material can be built up from a solution in a period of 5 minutes.

The augmentation reaction reagent is a solution, preferably inorganic and most preferably aqueous, of a metal salt. The cation of the metal salt is any more noble or electropositive metal than the metal of the finely divided powder, i.e., lies below the powder metal in the activity series, and which is electrically conductive. Any anion can be used which is relatively inert, i.e., does not deleteriously affect the process and which forms soluble salts with both the cation metal and the powder metal. Typical salts include copper nitrate, copper acetate, copper fluoroborate, potassium gold cyanide, nickel sulfate, nickel chloride, nickel sulfamate, potassium silver cyanide, silver chloride and the like. The presently preferred metal salt is copper sulfate. The concentration of the metal salt in the solution can range from 0.1 molar to saturation but is preferably about 0.5–2.0 molar. Below about 0.5 molar, deposition rates are inordinately slow and there is no improvement in rate at molarities above 2.0. Most preferably, the metal salt is present at a concentration of about 1 molar.

When copper sulfate is used as the augmentation metal, a copper layer is formed with new unoxidized copper which can be readily soldered. If further enhancement is desired or if soldering of the circuits is to be delayed for a substantial period of time, the conductor pattern formed can be dipped in a tin plating solution so that the tin will replace some of the copper. Tin and copper are very close in the activity series and the normal replacement reaction would cause copper to be plated out on the tin. However, by adding appropriate complexing ions, the tin will replace the copper. The tin plated copper thus formed is very readily soldered and can be left for periods of a month or more and good soldering can still be achieved. Suitable tin plating solutions are commercially available for plating on copper such as, for example, Coppertech Electroless Tin Plating Solution ST-210 or ST-240. The augmentation reaction can be carried out at any suitable temperature although elevated temperatures are generally preferred in order to increase reaction rate. Thus, any temperature from ambient up to about 100° C. can be employed although the temperature is preferably about 45°–60° C. Generally the augmentation reaction is completed in about 2–20 minutes or more, preferably about 5 minutes.

There are occasions when the adhesion of the newly plated solution metal to the powder metal surface may be less than desired. For example, adhesion is generally adequate if the area is to be a conductive pathway but increased adhesion is desired if connections or mounting is to take place. The reason is that the metal powder at the surface of the cured conductor ink pattern can become coated with a contaminate such as oxides or oils which will prevent good adhesion. Additionally, portions of the polymeric binder material may overlie the powder metal and interfere with proper adhesion. On such occasions, adhesion can be increased by abrading the surface of the powder metal particles either before or simultaneously with contact with the augmentative replacement solution. In the case of simultaneous application, the augmentation reaction on the metal particles will begin immediately with exchange in the areas where contaminate does not exist adhering to the metal particles. The abrasive will dislodge those areas where there is poorly adherent metal or contaminate or both, leaving a clean surface behind, and the augmentation reaction will then commence on the newly cleaned surfaces. In general, any non-reactive solid such as talc can be used as an abrasive. Powdered alumina and fine sea sand have been successfully used. One particularly interesting abrasive is anhydrous copper sulfate. If one employs an amount of anhydrous copper sulfate beyond that required for saturation, the excess will form a wet slurry which can be used as an abrasive and has the added property of supplying ions of copper for exchange and plating to the metal particles. Alternatively, a slurry of the abrasive and metal salt solution can be sprayed toward the conductor ink pattern. It should be noted that the abrading action need not be continuous in that the desired deposition can occur continuously with abrasive action taking place progressively over the substrate. Such action would be representative of mechanical rubbing systems such as rollers. Moreover, there need not be any loss of the material except for that which is plated onto the substrate, i.e., the abrasive and metal ion solution which is sprayed or rubbed on the substrate can be recovered and reused.

It is preferred to use zinc as the powder metal because of its very low cost and because zinc reacts readily with simple copper salt solutions. Unfortunately, the zinc reacts too vigorously resulting in a very porous and spongy copper film. Further, in some fabrication systems using iron powder, there is a moisture susceptibility problem because the iron has a tendency to rust. These problems can be avoided to a great extent by using a mixture of powdered metals.

One preferred powder metal mixture contains about 20–45% zinc, preferably about 25%, and 80–55% nickel, preferably about 75%. This combination exhibits a high degree of conductivity before the augmentative replacement reaction step and has certain advantages in reducing the rate of reaction with zinc because an enlarged electrically conductive surface area is presented to the metal salt solution while a relatively smaller proportion of that area is the quite reactive zinc powder. As a result, a high quality conductive coating is formed which has a very high degree of adhesion even though the reaction involves zinc and copper which are quite displaced from one another in the activity series of the metals. The presence of the nickel reduces this vigorous reaction. The resulting conductor system also has the advantage of being stable in the presence of high degrees of moisture. When iron is used as the reactive metal, it tends to rust and form an unsightly deposit on the surface of the conductor and in areas immediately adjacent to the conductor on the substrate. In closely spaced conductors, resistance between conductors can actually be reduced. In the nickel zinc system, the zinc does not rust and very little corrosion product is formed even in very high moisture environments. It further has been found that by raising temperatures at which the augmentative replacement is conducted to about 65° C. and by adding a small amount of nitric acid to the copper sulfate solution, improved coating can be achieved which is primarily manifested by a reduced resistivity of the conductor. It is believed that the nitric acid probably acts to clean the passivated surface of the nickel allowing it to enter into the replacement reaction rather than merely be coated.

Another mixed metal powder mixture contains about 20-35% copper powder, preferably about 25-30%, about 15-30% tin powder, preferably about 20-25%, about 10-25% aluminum powder, preferably about 15-20%, and about 25-40% iron powder, preferably about 30-35%. Improved adhesion as well as increased conductivity can also be obtained by pre-dipping a substrate inked with such a combination of metal powders in a solution of alkali such as sodium hydroxide. The caustic solution tends to attack the surface of the polymeric binder exposing more of the metal particles at the surface as well as sensitizing the aluminum. As a result, when the cured ink is dipped into an acidic copper sulfate solution, some plating also occurs on the aluminum due to an electrochemical reaction before the acid tends to anodize and passivate the aluminum. At this point, the iron, and to a much lesser extent the tin, are dissolved in the copper sulfate solution to form iron or tin sulfate while copper plates out on all of the exposed metal at the surface of the polymer. The conductivity can be varied in the above combination by increasing the percentage of iron and decreasing the other metals proportionally. The amount of tin can be reduced but this also reduces the solderability of the resulting conductor. Reducing the amount of copper and increasing the amount of aluminum or the total amount of the other materials in the cured ink will tend to reduce adhesion of ink to the substrate.

The application of the present invention to a flexible cable connection to a liquid crystal display cell is shown in the sole FIGURE. The liquid crystal cell 1 contains a liquid crystal layer 1a sandwiched between a bottom glass layer 2 and a top glass layer 3 and sealed at its peripheral edges with a suitable sealant 4. The interior surface 2a of bottom glass layer 2 carries a tin oxide conductor pattern 5. It should be understood that the interior surface 3a of top glass layer 3 will typically carry a conductor pattern, generally different from the bottom layer pattern, and generally internally connected to leads which are part of the bottom layer pattern. Therefore, all cell connections can be made to pads in the bottom layer pattern. A metal ink 6 of the present invention has been printed by conventional screen printing techniques on tin oxide layer 5, and thereafter cured. A contiguous layer of copper 7 has been established on the cured polymer layer 6 by the augmentation replacement reaction described above. It will be noted that in the FIGURE, the contiguous copper layer 7 contacts tin oxide layer 5 because the polymer layer 6 does not cover the entire exposed surface of tin oxide layer 5. In other constructions, metal ink 6 may cover the entire exposed surface of tin oxide layer 5. Copper layer 7 is solderable and is shown in the FIGURE soldered by means of a conventional tin/lead solder 8 to the copper layer 9 of a flexible cable.

In order to further illustrate the present invention, various examples are set forth below. It will be appreciated that these examples are set forth in order to further illustrate the invention, but are not intended to limit it. Further, it should be appreciated that all parts and percentages are by weight and all temperatures in degrees Celsius throughout this specification and claims unless otherwise indicated.

EXAMPLE 1

A metal ink was prepared by mixing 43 grams of −325 mesh brown tungsten oxide, 20 grams of −325 mesh zinc, 10 grams of −325 mesh nickel, 10.8 grams of a commercially available polyester resin and 7.2 grams of diethylene glycol monobutyl ether. The resulting ink was then applied to the surface of a glass plate which carried a conductive tin oxide pattern thereon and cured at about 150° C. for 0.5 hours. The resulting glass plate was then immersed for 5 minutes in a 1 molar aqueous solution of copper sulfate pentahydrate.

A flexible copper cable was soldered to the contiguous copper layer realized and the adhesion was determined to be about 1,000 pounds per square inch. The resistance of the connection to the conductive glass was so low that it could not be measured.

EXAMPLE 2

A metal ink was prepared by mixing 21 grams of zinc powder (−325 mesh), 63 grams of nickel powder (−325 mesh), 8 grams of Epon 828 epoxy and curing agent, and 8 grams of ethylene glycolmonobutyl ether solvent. This ink was printed on a tin-oxide-coated glass substrate. The ink was dried for 10 minutes at 150° and then cured for 20 minutes at 180° C. The substrate was then dipped in the copper sulfate solution of Example 1 for 5 minutes. Wires were soldered to the contiguous copper layer formed. Adhesion of greater than 1000 pounds per square inch was observed. The resistance of the connections was so low that it could not be measured. Note that the conductivity of the nickel/zinc metal powders is sufficient to give conduction from the contiguous layer to the tin oxide layer on the glass and a separate conductive powder is not needed in the polymer and is, in fact, not used.

Various changes and modifications can be made in the process and products of this invention without departing from the spirit and scope thereof. The various embodiments described herein were for the purpose of further illustrating the invention but were not intended to limit it.

What is claimed is:

1. An electrical conductor interconnect, comprising: a first conductor; a formation of a cured polymer containing a finely-divided first metallic composition and a second metal, said formation being positioned in electrical contact to said first conductor; and a contiguous layer of said second metal, wherein said second metal is below the metal of said first metallic composition in the activity series and wherein both said formation and said contiguous layer are electrically conductive and in electrical contact.

2. The electrical conductor interconnect of claim 1, further comprising a second conductor having a portion thereof electrically contacting at least said contiguous layer.

3. The electrical conductor of claim 2, wherein said contiguous layer is soldered to said second conductor.

4. The electrical conductor interconnect of claim 2, further comprising a substrate, said first conductor being disposed on selected portions of said substrate.

5. The electrical conductor interconnect of claim 4, wherein said substrate comprises glass; and said first conductor comprises a tin oxide conductive pattern upon a surface of said substrate.

6. The electrical conductor interconnect of claim 5, wherein the metal of said first metallic composition comprises nickel and zinc, and said second metal comprises copper.

7. The electrical conductor interconnect of claim 6, wherein said first metallic composition comprises about 20–45% zinc and about 55–80% nickel before said polymer is cured.

8. The electrical conductor interconnect of claim 6, wherein said first metallic composition comprises about 25% zinc and about 75% nickel, before said polymer is cured.

9. The electrical conductor interconnect of claim 6, wherein the polymer comprises a polyester.

10. The electrical conductor interconnect of claim 1, wherein said finely-divided first metallic composition has a particle size of less than about 50 microns.

11. The electrical conductor interconnect of claim 1, wherein said finely-divided first metallic composition is conductive.

12. The electrical conductor interconnect of claim 1, wherein said formation further includes a conductive powder.

13. The electrical conductor interconnect of claim 12, wherein said first metallic composition is not conductive.

14. The electrical conductor interconnect of claim 12, wherein said conductive powder comprises tungsten oxide and said second metal comprises copper.

15. The electrical conductor interconnect of claim 14, wherein said polymer comprises a polyester.

16. The electrical conductor interconnect of claim 15, wherein said first metallic composition comprises iron.

17. The electrical conductor interconnect of claim 15, wherein said first metallic composition comprises nickel and zinc.

18. A method for fabricating an electrical conductor interconnect, comprising the steps of: providing a first conductor pattern; applying to selected areas of the pattern a metal ink comprising a curable polymer and a finely-divided composition of a first metal; at least partially curing said metal ink; contacting the resulting substrate with a solution of a salt of a second metal in which the second metal is below said first metal of said finely-divided composition in the activity series and whose anion forms soluble salts with the cation of said first metal, to form a contiguous layer of said second metal on said metal ink; and attaching a second conductor to at least said contiguous layer.

19. The method of claim 18, wherein said metal ink further includes a conductive powder.

20. The method of claim 19, wherein said first metal has a particle size of less than about 50 microns.

21. The method of claim 20, wherein said conductive powder is present in an amount sufficient to provide a conductivity of about 200 Kohm per square of the ink after curing.

22. The method of claim 19, wherein said first metal and said conductive powder are present in an amount sufficient to be about 60–80% by volume of said ink after curing.

23. The method of claim 22, wherein said conductive powder is about 45–55 weight percent.

24. The method of claim 23, wherein said metal salt solution is an about 0.5–2.0 molar inorganic solution of the metal salt.

25. The method of claim 24, wherein said metal salt solution is an about 1 molar aqueous solution.

26. The method of claim 23, wherein said conductive powder comprises tungsten oxide and said second metal comprises copper.

27. The method of claim 26, wherein said polymer is a curable polyester.

28. The method of claim 27, wherein said first metal comprises iron.

29. The method of claim 27, wherein said first metal comprises nickel and zinc.

30. The method of claim 18, further including a substrate, said first conductor pattern being carried on said substrate.

31. The method of claim 30, wherein the substrate comprises glass.

32. The method of claims 30 or 31 wherein said first conductor comprises tin oxide.

33. The method of claim 32, wherein said metal ink contacts said tin oxide at at least one point.

34. The method of claim 30, wherein said polymer comprises a polyester, said first metal comprises about 25% zinc and about 75% nickel, said conductive powder comprises tungsten oxide and said metal salt solution comprises aqueous copper sulfate.

35. The method of claim 18, wherein said second conductor is soldered to said contiguous layer.

* * * * *